(12) United States Patent
Caiafa

(10) Patent No.: US 10,129,973 B2
(45) Date of Patent: Nov. 13, 2018

(54) VOLTAGE DIVIDER CIRCUIT ASSEMBLY AND METHOD

(71) Applicant: GENERAL ELECTRIC COMPANY, Schenectady, NY (US)

(72) Inventor: Antonio Caiafa, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 39 days.

(21) Appl. No.: 15/186,182

(22) Filed: Jun. 17, 2016

(65) Prior Publication Data

US 2017/0367174 A1 Dec. 21, 2017

(51) Int. Cl.
| | | |
|---|---|---|
| *H01C 3/02* | (2006.01) | |
| *H05K 1/02* | (2006.01) | |
| *H05K 1/18* | (2006.01) | |
| *H01C 13/00* | (2006.01) | |

(52) U.S. Cl.
CPC ............ *H05K 1/0216* (2013.01); *H01C 13/00* (2013.01); *H05K 1/182* (2013.01); *H05K 2201/10022* (2013.01)

(58) Field of Classification Search
CPC ...... H01C 13/00; H05K 1/0216; H05K 1/182; H05K 2201/10022
USPC .......................................................... 338/60
See application file for complete search history.

(56) References Cited

U.S. PATENT DOCUMENTS

| | | | |
|---|---|---|---|
| 4,586,008 A | | 4/1986 | Raleigh |
| 5,408,236 A | | 4/1995 | Freiheit-Jensen et al. |
| 6,100,750 A | * | 8/2000 | Van Der Zee ........... H03H 7/24 |
| | | | 327/362 |
| 7,471,137 B2 | * | 12/2008 | Bruin .................. H01L 23/5225 |
| | | | 257/E27.047 |

(Continued)

FOREIGN PATENT DOCUMENTS

| | | |
|---|---|---|
| DE | 19537155 A1 | 4/1997 |
| EP | 2508898 A1 | 10/2012 |
| GB | 2168495 A | 6/1986 |

OTHER PUBLICATIONS

Naidu et al., The Stray-Capacitance Equivalent Circuit for Resistive Voltage Dividers, Instrumentation and Measurement, IEEE Transactions, Sep. 1985, pp. 393-398, vol. IM-34-Issue 3.

*Primary Examiner* — Kyung Lee
(74) *Attorney, Agent, or Firm* — GE Global Patent Operation; Pabitra K. Chakrabarti

(57) ABSTRACT

A voltage divider circuit assembly includes resistors, an external electrostatic shield, and internal electrostatic shield (s). The resistors are in series with each other between input terminals that receive an input voltage. An external resistor is disposed between sensing terminals that conduct an output voltage that is the input voltage divided by the resistors in the series. The external shield is conductively coupled with the series of the resistors with the external resistor disposed outside of the external shield and the other resistor(s) inside the external shield. The internal shield(s) are conductively coupled with the resistors and disposed inside the external (Continued)

shield. A first internal resistor is disposed inside the external shield and outside of the internal shield(s). One or more remaining resistors are inside the internal shield(s). The shields divide parasitic capacitances to enable the measurement of dynamically changing high voltage input signals.

19 Claims, 8 Drawing Sheets

(56) References Cited

U.S. PATENT DOCUMENTS

| | | | |
|---|---|---|---|
| 7,577,235 B2* | 8/2009 | Jedlitschka | G05F 1/63 378/101 |
| 7,902,907 B2* | 3/2011 | Tanzawa | H01L 27/0802 327/530 |
| 9,063,175 B2* | 6/2015 | Adam | H03H 7/24 |
| 2005/0285660 A1* | 12/2005 | Bruin | H01L 23/5225 327/415 |
| 2013/0342187 A1 | 12/2013 | Hozoi et al. | |
| 2014/0021965 A1 | 1/2014 | De Rybel | |
| 2015/0153391 A1 | 6/2015 | Podzemny et al. | |

* cited by examiner

VOLTAGE DIVIDER CIRCUIT ASSEMBLY AND METHOD

CROSS-REFERENCE TO RELATED APPLICATIONS

This application claims priority to U.S. Application No. 62/266,811, filed 14 Dec. 2015, the entire disclosure of which is incorporated herein by reference.

FIELD

Embodiments of the subject matter described herein relate to circuit assemblies, such as circuits used to measure electrical characteristics of a system.

BACKGROUND

Various systems include electrical systems that operate using a variety of currents or voltages. Some of these systems can use high voltages that are monitored to examine the health of the systems, to prevent damage to the systems, etc. When performing high voltage measurements, a very high resistance feedback may be needed to provide a proportional measured value. For example, for measuring high voltages conducted in a system, a voltage dividing circuit having resistances on the order of tens of mega-ohms may be used to output a voltage that is proportional to the high voltage that is measured, but that is on the order of a few volts.

For very accurate measurements, resistances as accurate as 0.01% can be found to provide static measurements of the high voltages. If the high voltages that are to be measured are dynamically changing (e.g., the high voltage changes during time periods of a few milliseconds), a pure resistive dividing circuit will not be able to accurately measure the changing high voltages. The parasitic capacitances between the resistors in the dividing circuit will slow the output voltage such that the dynamically changing high voltage cannot be accurately measured.

BRIEF DESCRIPTION

In one embodiment, an assembly (e.g., a voltage divider circuit assembly) includes plural resistors and an external electrostatic shield. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. This output voltage may be conducted to a sensing device, such as a voltmeter. The external electrostatic shield is conductively coupled with the series of the resistors with the external resistor disposed outside of the external electrostatic shield and the resistor or the resistors in the series other than the external resistor disposed inside the external electrostatic shield.

In another embodiment, another assembly (e.g., another voltage divider circuit assembly) includes plural resistors, an external electrostatic shield, and one or more internal electrostatic shields. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. The external electrostatic shield is conductively coupled with the series of the resistors with the external resistor disposed outside of the external electrostatic shield and the resistor or the resistors in the series other than the external resistor disposed inside the external electrostatic shield. The one or more internal electrostatic shields conductively coupled with the series of resistors and disposed inside the external electrostatic shield. A first internal resistor in the series of resistors is disposed inside the external electrostatic shield and outside of the one or more internal electrostatic shields. At least one remaining resistor of the series of resistors other than the external resistor and the first internal resistor is disposed inside the one or more internal electrostatic shields.

In another embodiment, another assembly (e.g., another voltage divider circuit assembly) includes plural resistors, an external electrostatic shield, one or more internal electrostatic shields, and a circuit board. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. The external electrostatic shield is conductively coupled with the series of the resistors with the external resistor disposed outside of the external electrostatic shield and the resistor or the resistors in the series other than the external resistor disposed inside the external electrostatic shield. The one or more internal electrostatic shields are conductively coupled with the series of resistors and disposed inside the external electrostatic shield. A first internal resistor in the series of resistors is disposed inside the external electrostatic shield and outside of the one or more internal electrostatic shields. The circuit board is formed from dielectric layers and conductive layers. The external electrostatic shield includes at least one of the conductive layers in the circuit board and the one or more internal electrostatic shields include one or more of the conductive layers in the printed circuit board. The conductive layers included in the external electrostatic shield and the one or more internal electrostatic shields are separated from each other by one or more of the dielectric layers of the circuit board.

BRIEF DESCRIPTION OF THE DRAWINGS

The subject matter described herein may be understood from reading the following description of non-limiting embodiments, with reference to the attached drawings, wherein.

DETAILED DESCRIPTION

One or more embodiments of the inventive subject matter described herein relate to voltage divider circuit assemblies and methods that use a system of electrostatic shields to reduce or minimize the effect of parasitic capacitances caused by highly resistive elements in the assemblies while allowing the use of a resistive voltage divider for measuring high voltage, fast changing signals. The circuit assemblies can be used to measure high voltages (such as 100,000 or more volts and up to 900,000 volts, up to 1,000,000 volts, or another upper limit) that dynamically change values over relative short time periods, such as several milliseconds (e.g., less than 5 milliseconds). The parasitic capacitances that typically slow the measured output voltage (and thereby prevent the accurate measurement of fast-changing high voltage signals) are divided by the electrostatic shields into smaller sub-parasitic capacitances, which are then conducted or moved to a location where the parasitic capacitances are reduced or eliminated (e.g., by directly conducting the parasitic capacitances to a ground reference).

Figure 1:
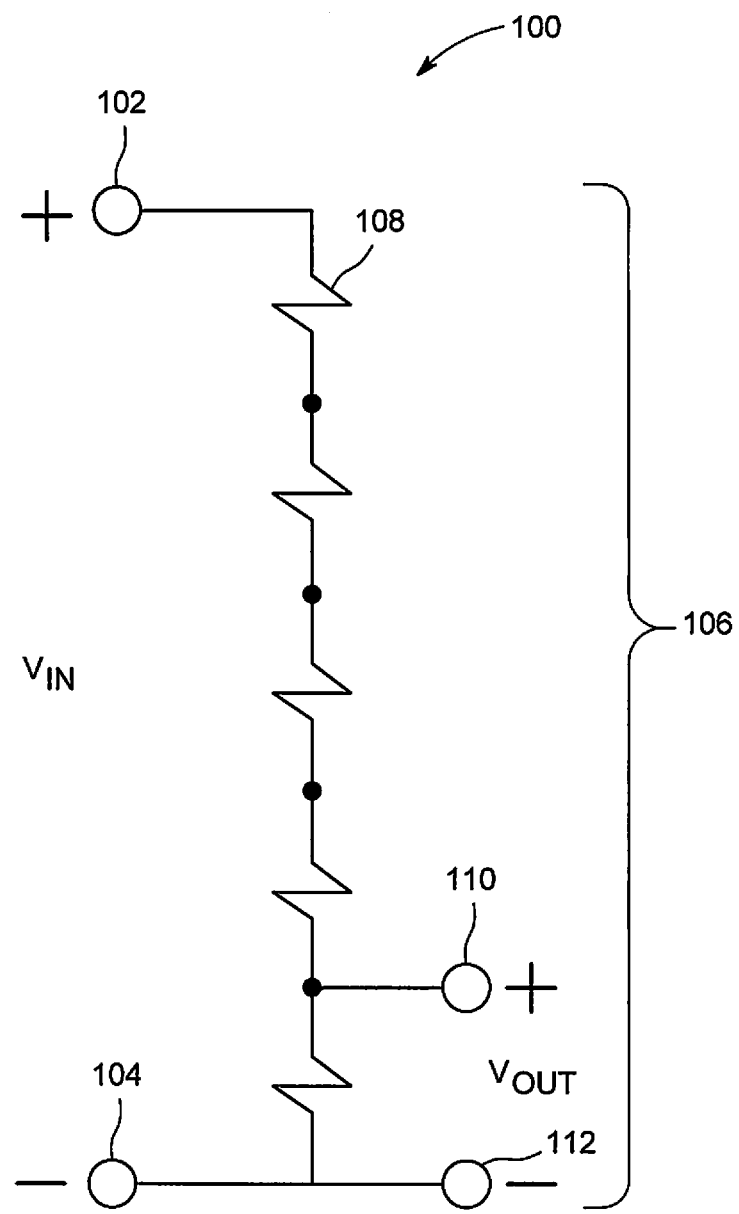
FIG. 1 illustrates one example of a voltage divider circuit assembly.

FIG. 1 illustrates one example of a voltage divider circuit assembly 100. The circuit assembly 100 includes conductive input terminals 102, 104 that apply (or receive) an input voltage signal ("Vin" in FIG. 1) across the input terminals 102, 104. The input terminal 104 may represent a ground reference or other reference. The input voltage signal is conducted through and divided by a series 106 of resistive elements 108, or resistors. Conductive sensing terminals 110, 112 conduct an output voltage signal ("Vout" in FIG. 1) that was conducted through the series 106 of resistive elements 108. For example, the sensing terminals 110, 112 may conduct an output voltage that is proportional to the input voltage divided by the resistors 108. In one aspect, the resistive elements 108 may have resistances of twenty-five mega-ohms (or another value) such that the circuit assembly 100 divides the input voltage (e.g., 100,000 volts) into an output voltage of 99.9 volts.

A sensor, such as a voltmeter or the like, may be coupled with the sensing terminals 110, 112 to measure the output voltage. In the illustrated example, the sensing terminals 110, 112 conduct the voltage that is conducted across or through a last one of the resistors 108 in the series as the output voltage. The output voltage that is sensed may be proportional to the input voltage.

For example, the ratio of the input voltage to the output voltage may be 1001:1 or another ratio, such that the measured output voltage can be used to determine the input voltage.

Figure 2:
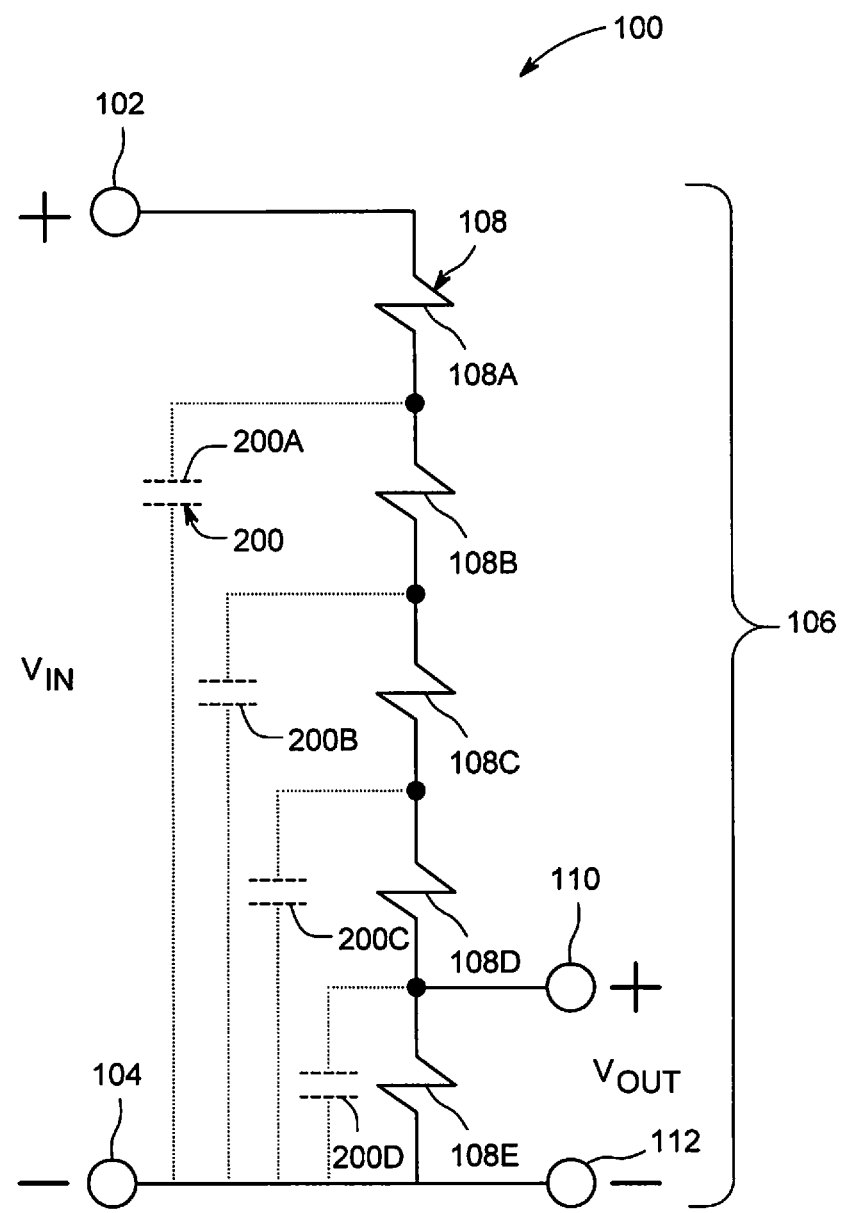
FIG. 2 illustrates the voltage divider circuit assembly shown in FIG. 1 with parasitic capacitances schematically shown.

FIG. 2 illustrates the voltage divider circuit assembly 100 shown in FIG. 1 with parasitic capacitances schematically shown. In FIG. 2, several capacitive elements 200 are shown in phantom view to represent parasitic capacitances in the circuit assembly 100 caused by the highly resistive resistors 108 in the series 106. In the illustrated example, the circuit assembly 100 includes five resistors 108 (e.g., resistors 108A-E), but optionally may include a greater or lesser number of resistors 108. The parasitic capacitances represent four parasitic capacitors 200 (e.g., capacitors 200A-D).

These parasitic capacitances may be present in the circuit assembly 100 shown in FIGS. 1 and 2, and can significantly slow conduction of the input voltage through the circuit assembly 100. As a result, changes in the input voltage may not be conducted out of the circuit assembly 100 as the output voltage. For example, a change in the input voltage may occur over such a short time period that the parasitic capacitances 200 prevent the output voltage from exhibiting a proportional change. Consequently, dynamic changes in the input voltage may not be detected by monitoring the output voltage due to the parasitic capacitances. For example, changes in the input voltage that occur over less than ten milliseconds may not be present in the output voltage.

Figure 3:
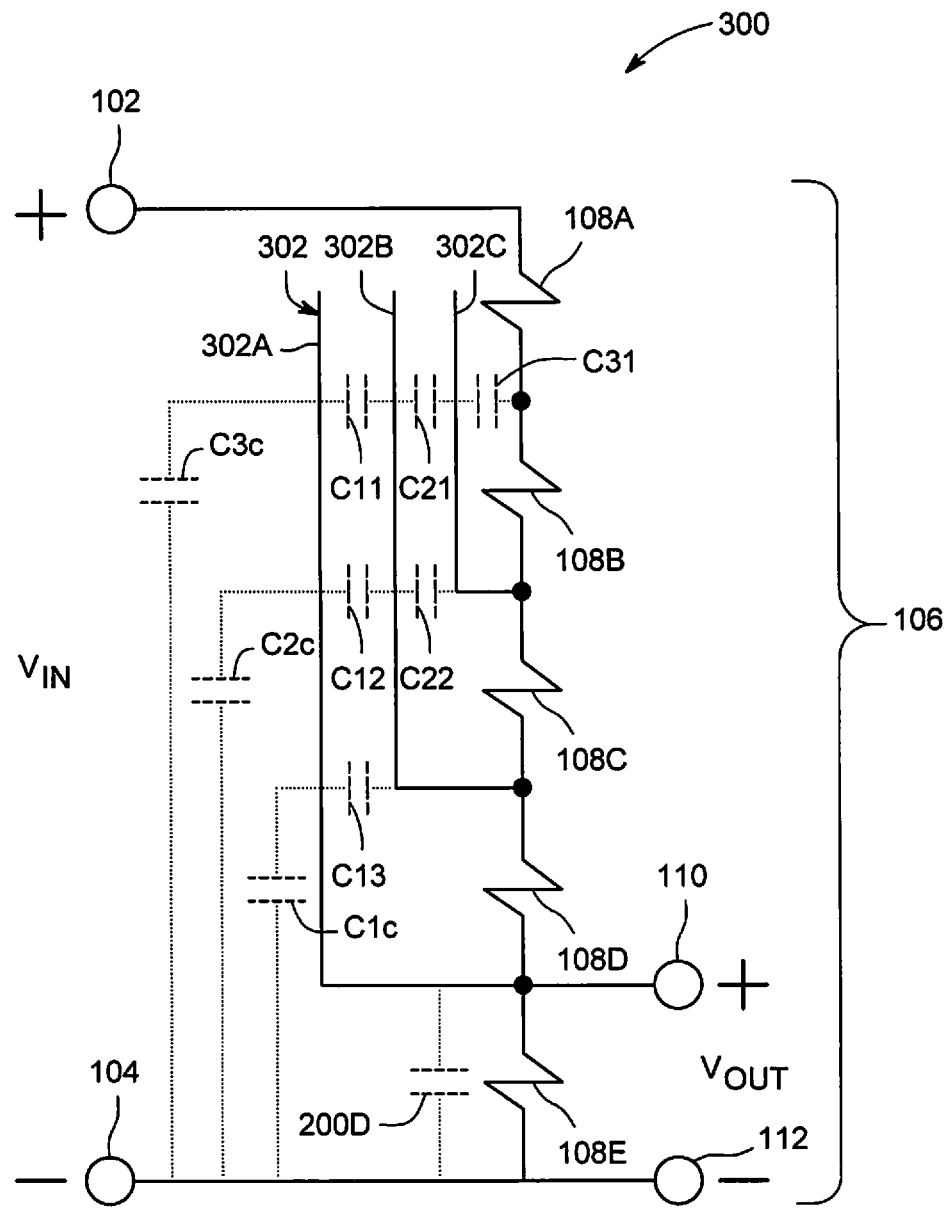
FIG. 3 illustrates a voltage divider circuit assembly according to one embodiment.

FIG. 3 illustrates a voltage divider circuit assembly 300 according to one embodiment. Similar to the circuit assembly 100 shown in FIGS. 1 and 2, the circuit assembly 300 includes the input terminals 102, 104, the series 106 of resistive elements 108, and the sensing terminals 110, 112. In contrast to the circuit assembly 100, the circuit assembly 300 includes several conductive electrostatic shields 302 (e.g., shields 302A-C). The electrostatic shields 302 are conductively coupled with the series 106 of resistors 108 in locations between different pairs of the resistors 106. The electrostatic shields 302 may be conductively coupled with the ground reference of the circuit assembly 300. In one embodiment, the electrostatic shields 302 are not otherwise conductively coupled with each other. For example, the electrostatic shields 302 may all be conductively coupled with the ground reference, but not with each other prior to (or in another location than) the connection to the ground reference (e.g., the terminal 104).

The electrostatic shields 302 extend from the conductive connections with the series 106 of resistors 108. The electrostatic shields 302 are disposed between different groups of the resistors 108. For example (and as described in more detail below), the electrostatic shield 302A is disposed between the resistor 108E (also referred to herein as the sensing resistor, as this is the resistor across which the output voltage is measured) and the remaining resistors 108A-D. The electrostatic shield 302A separates the resistor 108E from the resistors 108A-D. The electrostatic shield 302B is disposed between the resistors 108D, 108E and the remaining resistors 108A-C. The electrostatic shield 302B separates the resistors 108D, 108E from the resistors 108A-C. The electrostatic shield 302C is disposed between the resistors 108C-E and the remaining resistors 108A-B. The electrostatic shield 302C separates the resistors 108C-E from the resistors 108A-B. While five resistors 108 and three electrostatic shields 302 are shown, alternatively, a larger or smaller number of resistors 108 and/or shields 302 may be used. In one embodiment, only a single shield (e.g., the shield 302A) may be used.

The electrostatic shields 302 divide the parasitic capacitances 200 (shown in FIG. 2) that otherwise would be present between the neighboring resistors 108 in each pair of the resistors 108 in the series 106. The parasitic capacitance 200A in FIG. 2 is divided by the electrostatic shields 302 (e.g., the shields 302A-C) into several smaller parasitic capacitances represented by parasitic capacitors $C3c$, $C11$, $C21$, and $C31$ in FIG. 3. The parasitic capacitance 200B in FIG. 2 is divided by the electrostatic shields 302 (e.g., the shields 302B, 302C) into several smaller parasitic capacitances represented by parasitic capacitors $C2c$, $C12$, and $C22$ in FIG. 3. The parasitic capacitance 200C in FIG. 2 is divided by the electrostatic shield 302A into several smaller parasitic capacitances represented by parasitic capacitors $C1c$ and $C13$ in FIG. 3. The shields 302 may directly conduct these smaller parasitic capacitances to the ground reference (e.g., the terminal 104), such as by conducting the parasitic capacitances to the ground reference without conducting the parasitic capacitances through one or more other conductive bodies prior to conducting the parasitic capacitances to the ground reference. Because each shield 302 is conducting smaller parasitic capacitances to the ground reference, with the parasitic capacitance 200D in FIG. 3 being reduced relative to the capacitance 200D shown in FIG. 2, the parasitic capacitances otherwise caused by the resistors 108 being connected with each other is directly conducted out or the circuit assembly 300 without significantly delaying the output voltage signal. As a result, rapid changes in the input voltage signal (e.g., changes occurring over a time period of a few milliseconds or less), are represented by proportional changes in the output voltage, in contrast to the circuit assembly 100 shown in FIGS. 1 and 2. While there are some additional parasitic capacitances C11, C21, C12, C22, C13 that extend between and are due to the presence of the shields 302, these capacitances are relatively small and do not significantly slow conduction of changes in the input voltage signal through the circuit assembly 300.

Figure 4:
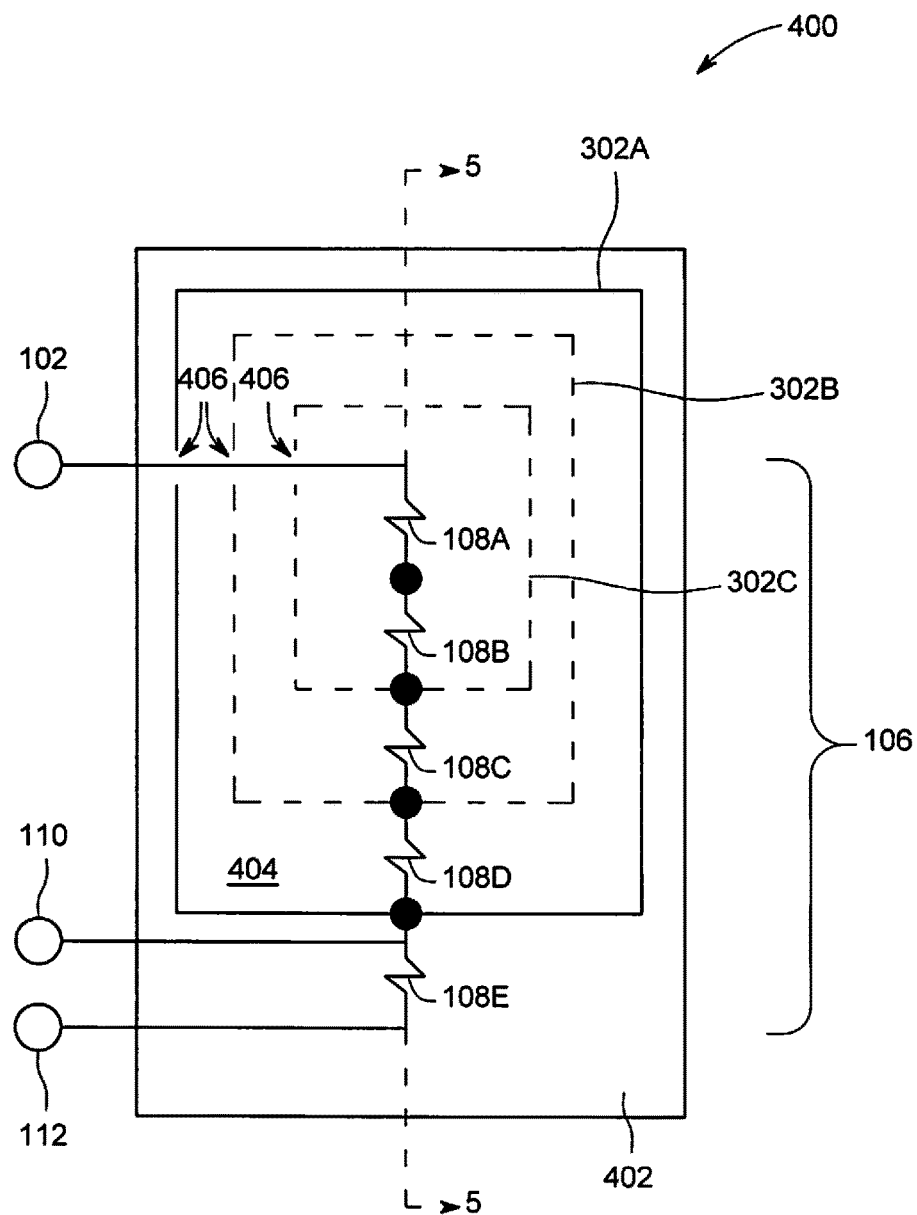
FIG. 4 illustrates a voltage divider circuit assembly according to one embodiment.

FIG. 4 illustrates a voltage divider circuit assembly 400 according to one embodiment. Similar to the circuit assembly 300 shown in FIG. 3, the circuit assembly 400 includes the input terminals 102, 104, the series 106 of resistive elements 108, the sensing terminals 110, 112, and the electrostatic shields 302. Although the terminal 104 is not shown in FIG. 4, the terminal 104 may be the same conductive body as the terminal 112. The circuit assembly 400 also includes a circuit board 402, such as a printed circuit board formed from conductive layers and non-conductive (e.g., dielectric) layers. The shields 302 may be formed as enclosures having the shapes of boxes (or other shapes. The shields 302 define internal chambers 404 with different resistors 108 and/or shields 302 disposed in the internal chambers 404. For example, the outermost shield 302A may be referred to as an external shield 302 with the sensing resistor 108E outside of the internal chamber 404 of the external shield 302 and the shields 302B-C and resistors 108A-D disposed inside the external shield 302.

The shield 302B may be referred to as a first internal shield 302 with the resistors 108D, 108E outside of the internal chamber 404 of the shield 302B but the shield 302C and the resistors 108A-C inside the shield 302B. The shield 302C may be referred to as a second internal shield 302 with the resistors 108C-E outside of the internal chamber 404 of the shield 302C but the resistors 108A, 108B inside the shield 302C. In the illustrated embodiment, no shield 302 is disposed inside the shield 302C. Alternatively, a different number of resistors 108 may be inside or outside one or more of the shields 302, and/or one or more additional shields 302 may be inside the second internal shield 302C.

The series 106 of resistors 108 are conductively coupled with the shields 302. For example, the second internal shield 302C may be conductively coupled with the series 106 in a location that is between the resistor 108B that is inside the shield 302C and the resistor 108C that is outside the shield 302C. The first internal shield 302B may be conductively coupled with the series 106 in a location that is between the resistor 108C that is inside the shield 302B and the resistor 108D that is outside the shield 302B. The external shield 302A may be conductively coupled with the series 106 in a location that is between the resistor 108D that is inside the shield 302A and the resistor 108E that is outside the shield 302A.

The shields 302 may not be conductively coupled with each other (other than being coupled with the ground reference and the series 106 of resistors 108). The shields 302 may be formed from conductive bodies that do not directly contact each other (aside from the resistors 108 disposed between the shields 302). For example, the shields 302 may not be conductively coupled by any component having a lower resistance than the resistors 108.

As shown in FIG. 4, the input terminal 102 extends through openings 406 in the shields 302 to prevent the input terminal 102 from being conductively coupled with any of the shields 302. The openings 406 can be at least partially filled with a dielectric material to seal the openings 406 and/or to prevent the input terminal 102 from contacting the shields 302. Alternatively, the openings 406 may not be at least partially filled with a dielectric material. The input terminal 102 extends into the shields 302 to be conductively coupled with the series 106 of resistors 108.

Figure 5:
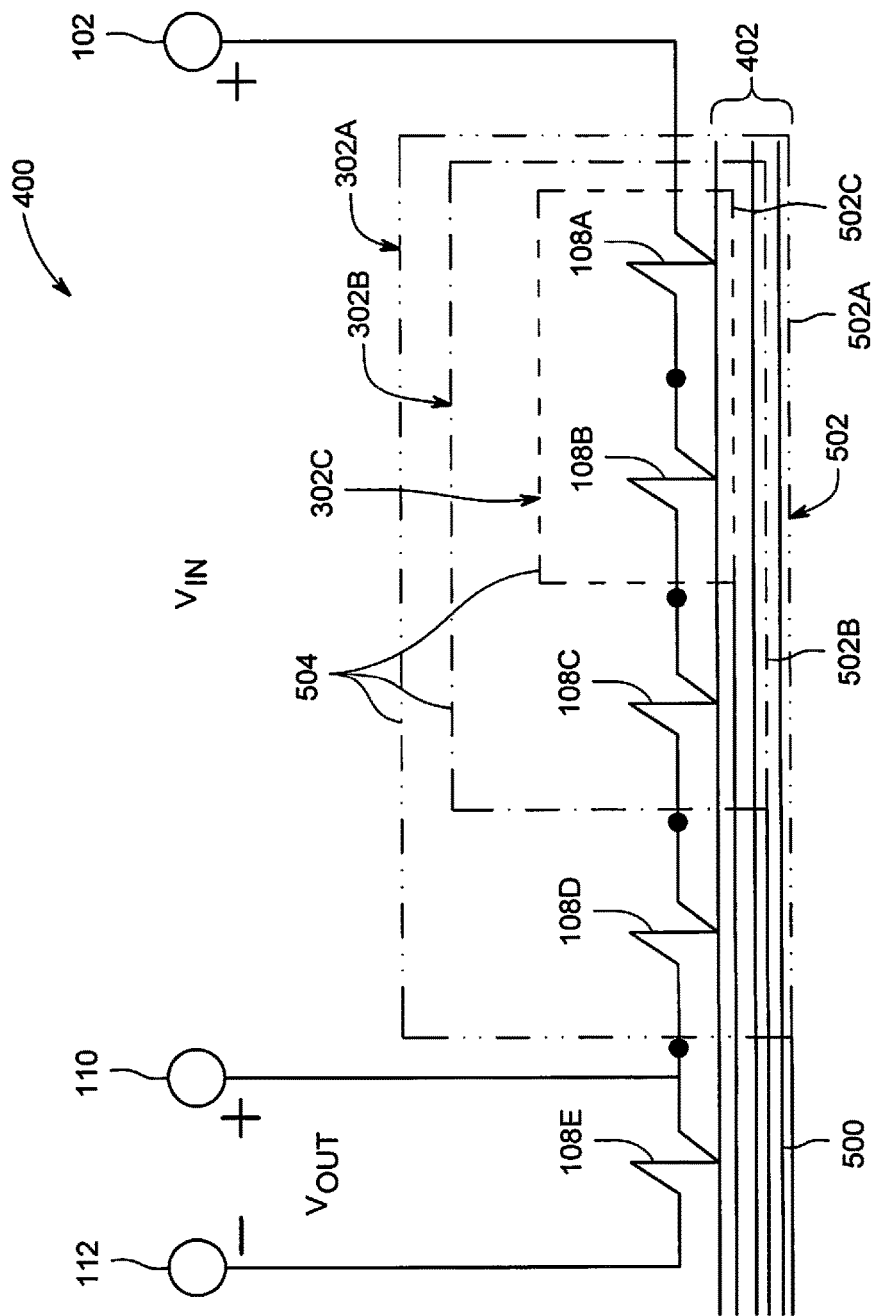
FIG. 5 illustrates a cross-sectional view of the circuit assembly along line 5-5 shown in FIG. 4.

FIG. 5 illustrates a cross-sectional view of the circuit assembly 400 along line 5-5 shown in FIG. 4. The circuit board 402 is formed from several dielectric layers 500 and conductive layers 502 (e.g., conductive layers 502A-C). The conductive layers 502 form part of the shields 302. For example, the conductive layer 502A can form a bottom side of the external shield 302A, the conductive layer 502B can form a bottom side of the first internal shield 302B, and the conductive layer 502C can form a bottom side of the second internal shield 302C. The conductive layers 502 may laterally extend through the circuit board 400 in directions that are parallel to the top and bottom surfaces of the circuit board 400.

The shields 302 can be formed from conductive bodies 504, such as conductive sheets, that form tops and sides (e.g., four sides) of the boxes formed by the shields 302. Alternatively, the bodies 504 may form shapes other than boxes. In contrast to the conductive layers 502, the conductive bodies 504 are outside of the circuit board 400, such as on top of one side of the circuit board 400. For a given shield 302, portions of the bodies 504 can vertically extend upward from the circuit board 400 to form the vertically extending four sides of the box formed by the shield 302, with another portion of the bodies 504 extending laterally between these sides (and parallel to the top and/or bottom of the circuit board 400). The bottom side of the boxes formed by the shield 302 is provided by the conductive layer 502 in the circuit board 400. As described below, conductive vias can vertically extend through the circuit board 400 to conductively couple the conductive body 504 or bodies 504 of a shield 302 with the conductive layer 502 of the same shield 302 to form the conductive enclosure created by the shield 302. The vias and conductive layers 502 are separated from each other by dielectric layers 500 and/or segments of the dielectric layers 500 to prevent different shields 302 from being conductively coupled with each other by vias or conductive layers 502.

Figure 6:
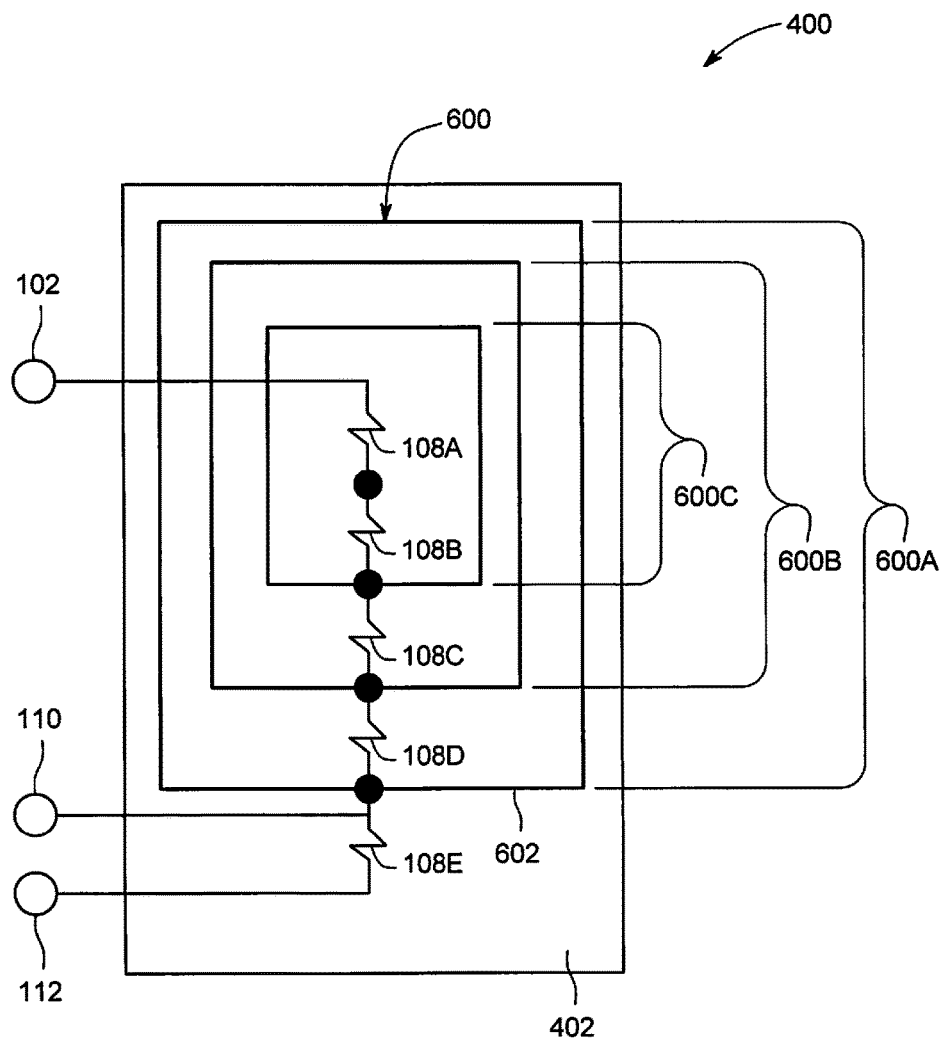
FIG. 6 illustrates a top view of the circuit assembly shown in FIGS. 4 and 5 with conductive bodies of shields shown in FIG. 5 removed.

FIG. 6 illustrates a top view of the circuit assembly 400 shown in FIGS. 4 and 5 with the conductive bodies 504 of the shields 302 shown in FIG. 5 removed. In order to conductively couple different conductive layers 502 (shown in FIG. 5) with different conductive bodies 504 to form the shields 302, different sets 600 (e.g., sets 600A-C) of conductive vias 602 may vertically extend through the circuit board 402. The conductive vias 602 may be blind vias that extend through the dielectric layers 500 (shown in FIG. 5) of the circuit board 402 to conductively couple the conductive layers 502 with the conductive bodies 504.

In the illustrated example, the set 600A of the conductive vias 602 extends through the circuit board 402 to conductively couple the conductive layer 502A with one or more conductive bodies 504 to form the shield 302A (shown in FIG. 3). Another set 600B of the conductive vias 602 extends through the circuit board 402 to conductively couple the conductive layer 502B with one or more conductive bodies 504 to form the shield 302B (shown in FIG. 3). Another set 600C of the conductive vias 602 extends through the circuit board 402 to conductively couple the conductive layer 502C with one or more conductive bodies 504 to form the shield 302C (shown in FIG. 3). The different sets 600 of the conductive vias 602 are laterally separated from each other (e.g., in directions that are parallel to the illustrated surface of the circuit board 402) to prevent the shields 302 from being conductively coupled with each other by the vias 602. Additionally, different sets 600 of the vias 602 extend different distances into the circuit board 402. The conductive layers 502 forming parts of different shields 302 are disposed at different depths in the circuit board 402 to prevent the shields 302 from being conductively coupled with each other inside the circuit board 402. As a result, the different sets 600 of the vias 602 extend correspondingly different depths into the circuit board 402 to connect different conductive layers 502 with different conductive bodies 504 to form the different shields 302 without conductively coupling the shields 302.

The vias 602 in one or more (or each) of the sets 600 may be continuous to form a continuous conductive ring in the circuit board 402. As shown in FIG. 6, these types of continuous sets 600 of vias 602 form conductive rings disposed inside each other, with different conductive rings included in different shields 302.

Figure 7:
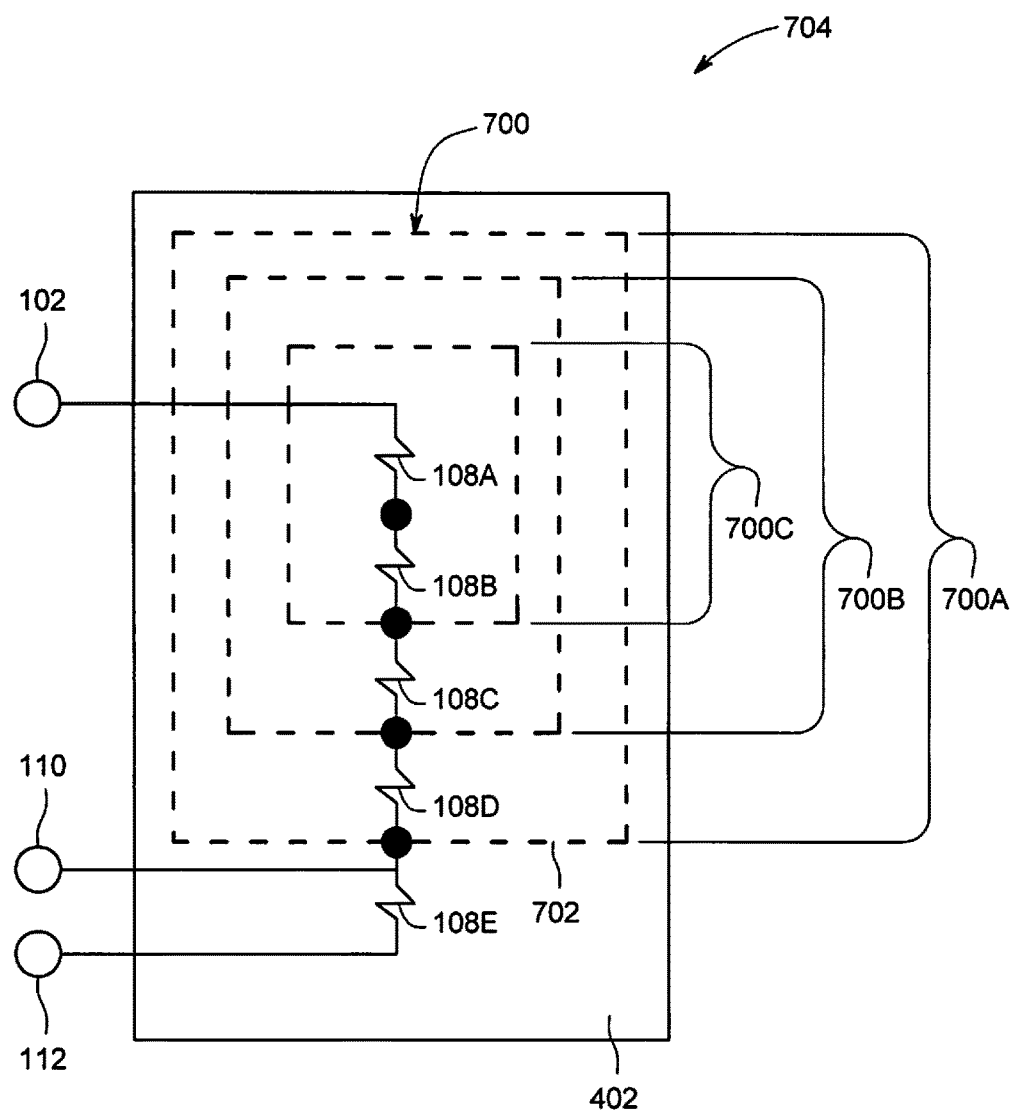
FIG. 7 illustrates a top view of a voltage divider circuit assembly according to one embodiment.

FIG. 7 illustrates a top view of a voltage divider circuit assembly 704 according to one embodiment. Similar to the circuit assemblies 300, 400 shown in FIGS. 3-6, the circuit assembly 704 includes the input terminals 102, 104, the series 106 of resistive elements 108, the sensing terminals 110, 112, the electrostatic shields 302, and the circuit board 400. Although the terminal 104 is not shown in FIG. 7, the terminal 104 may be the same conductive body as the terminal 112.

Similar to the circuit assembly 400 shown in FIG. 6, in order to conductively couple different conductive layers 502 (shown in FIG. 5) with different conductive bodies 504 to form the shields 302, different sets 700 (e.g., sets 700A-C) of conductive vias 702 may vertically extend through the circuit board 402. The conductive vias 702 may be blind vias that extend through the dielectric layers 500 (shown in FIG. 5) of the circuit board 402 to conductively couple the conductive layers 502 with the conductive bodies 504.

In the illustrated example, the set 700A of the conductive vias 702 extends through the circuit board 402 to conductively couple the conductive layer 502A with one or more conductive bodies 504 to form the shield 302A (shown in FIG. 3). Another set 700B of the conductive vias 702 extends through the circuit board 402 to conductively couple the conductive layer 502B with one or more conductive bodies 504 to form the shield 302B (shown in FIG. 3). Another set 700C of the conductive vias 702 extends through the circuit board 402 to conductively couple the conductive layer 502C with one or more conductive bodies 504 to form the shield 302C (shown in FIG. 3). The different sets 700 of the conductive vias 702 are laterally separated from each other (e.g., in directions that are parallel to the illustrated surface of the circuit board 402) to prevent the shields 302 from being conductively coupled with each other by the vias 702. Additionally, different sets 700 of the vias 702 extend different distances into the circuit board 402. The conductive layers 502 forming parts of different shields 302 are disposed at different depths in the circuit board 402 to prevent the shields 302 from being conductively coupled with each other inside the circuit board 402. As a result, the different sets 700 of the vias 702 extend correspondingly different depths into the circuit board 402 to connect different conductive layers 502 with different conductive bodies 504 to form the different shields 302 without conductively coupling the shields 302.

In contrast to the continuous vias 602 in the circuit assembly 400 shown in FIG. 6, the vias 702 in one or more (or each) of the sets 700 may be discrete from each other. For example, the vias 702 in the sets 700 may be laterally separated from each other in two or more directions that are parallel to the surface of the circuit board 400, as shown in FIG. 7.

Figure 8:
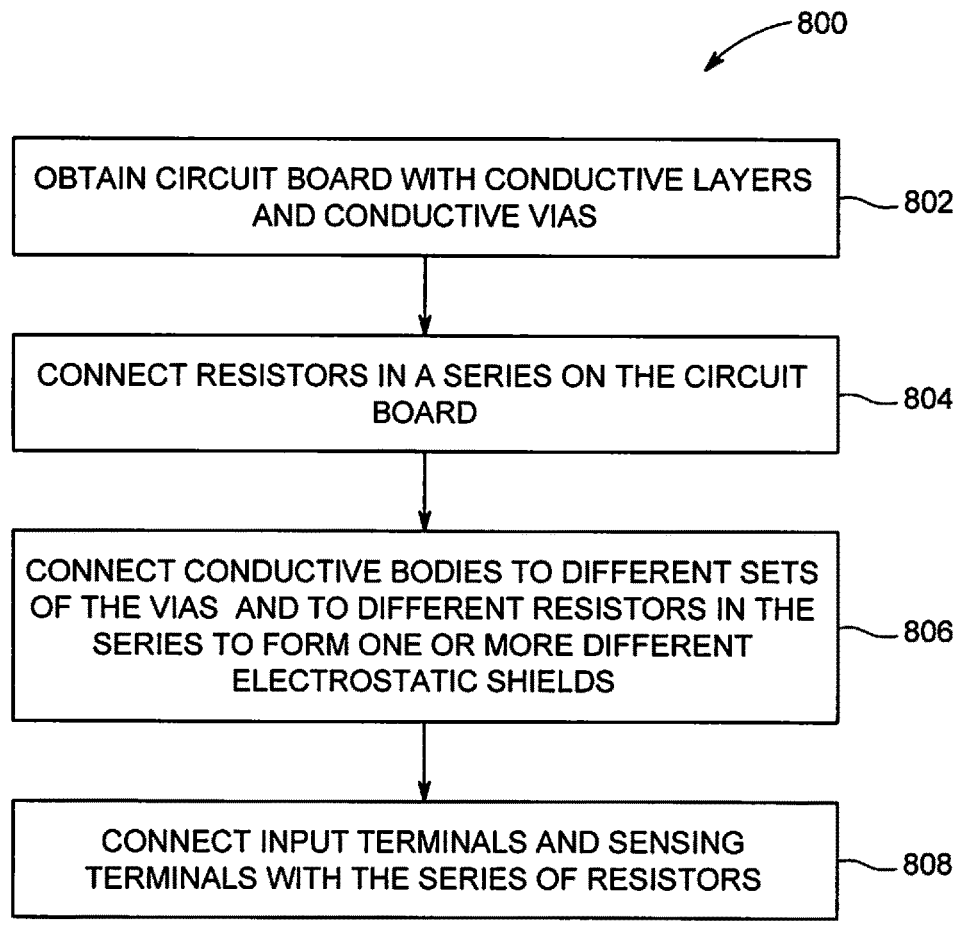
FIG. 8 illustrates a flowchart of one embodiment of a method for manufacturing a voltage divider circuit assembly.

FIG. 8 illustrates a flowchart of one embodiment of a method 800 for manufacturing a voltage divider circuit assembly. The method 800 may be used to create one or more embodiments of the circuit assemblies described herein. At 802, a circuit board is obtained. The circuit board may include conductive layers, dielectric layers, and conductive vias. The conductive layers may be conductively coupled with the vias and the conductive layers may be separated from each other by the dielectric layers to prevent the conductive layers being conductively coupled with each other. The vias may be arranged in rings that extend around each other.

At 804, several resistors are conductively coupled with each other in a series. The resistors may be connected with the circuit board. At 806, different conductive bodies are connected to different sets of the vias in the circuit board and to the resistors to form one or more different electrostatic shields. The bodies may form five sided boxes or other partial enclosures that, when conductively coupled with different sets of the vias, form different conductive enclosures. As shown in FIGS. 4 and 5, the electrostatic shields formed by the conductive enclosures can be nested inside each other, similar to a matryoshka doll. The electrostatic shields can separate different groups of the resistors from each other, as described above.

At 808, input terminals and sensing terminals are connected with the series of resistors. For example, the input terminals may be connected with opposite ends of the series of resistors and the sensing terminals may be connected on opposite ends of one of the resistors, such as a resistor that is at the end of the series, that is outside of the electrostatic shields, or the like. The circuit assembly formed in this manner may be used to measure dynamically changing high voltage signals, such as voltages having magnitudes of tens or hundreds of thousands of volts that change within milliseconds. The measured output voltages may be a fraction of the input voltages, such as several volts, tens of volts, or hundreds of volts.

In one embodiment, an assembly (e.g., a voltage divider circuit assembly) includes plural resistors and an external electrostatic shield. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. This output voltage may be conducted to a sensing device, such as a voltmeter. The external electrostatic shield is conductively coupled with the series of the resistors with the external resistor disposed outside of the external electrostatic shield and the resistor or the resistors in the series other than the external resistor disposed inside the external electrostatic shield.

In one aspect, the external electrostatic shield surrounds an internal chamber in which the resistor or the resistors in the series other than the external resistor are disposed.

In one aspect, the external electrostatic shield divides a parasitic capacitance between neighboring resistors in the series of resistors into smaller capacitances and directly conducts the smaller capacitances to an electrical ground.

In one aspect, the resistors in the series include a first internal resistor that is conductively coupled with the external resistor and disposed inside the external electrostatic shield. The assembly also can include a first internal electrostatic shield disposed inside the external electrostatic shield and conductively coupled with the series of resistors with the external resistor and the first internal resistor disposed outside of the first internal electrostatic shield and the resistor or the resistors in the series of resistors other than the external resistor and the first internal resistor disposed inside the first internal electrostatic shield.

In one aspect, the resistors in the series include a second internal resistor that is conductively coupled with the first internal resistor and disposed inside the external electrostatic shield and the first internal electrostatic shield. The assembly also can include a second internal electrostatic shield disposed inside the first internal electrostatic shield and the external electrostatic shield. The second internal electrostatic shield is conductively coupled with the series of resistors with the first internal resistor and the second internal resistor disposed outside of the second internal electrostatic shield and the resistor or the resistors in the series of resistors other than the external resistor, the first internal resistor, and the second internal resistor disposed inside the second internal electrostatic shield.

In one aspect, the resistors in the series include at least a third internal resistor that is conductively coupled with the second internal resistor and disposed inside the external electrostatic shield, the first internal electrostatic shield, and the second internal electrostatic shield.

In one aspect, a first input terminal of the input terminals is coupled with the at least the third internal resistor inside the second internal electrostatic shield and the sensing terminals are coupled with the sensing resistor outside of the external electrostatic shield.

In one aspect, the assembly also includes one or more internal electrostatic shields disposed inside the external electrostatic shield with different resistors of the resistors in the series disposed inside different shields of the external electrostatic shield and the one or more internal electrostatic shields.

In one aspect, the assembly also includes a circuit board formed from dielectric layers and conductive layers. The external electrostatic shield can include at least one of the conductive layers in the circuit board and the one or more internal electrostatic shields include one or more of the conductive layers in the printed circuit board. The conductive layers included in the external electrostatic shield and the one or more internal electrostatic shields are separated from each other by one or more of the dielectric layers of the circuit board.

In another embodiment, another assembly (e.g., another voltage divider circuit assembly) includes plural resistors, an external electrostatic shield, and one or more internal electrostatic shields. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. The external electrostatic shield is conductively coupled with the series of the resistors with the external resistor disposed outside of the external electrostatic shield and the resistor or the resistors in the series other than the external resistor disposed inside the external electrostatic shield. The one or more internal electrostatic shields conductively coupled with the series of resistors and disposed inside the external electrostatic shield. A first internal resistor in the series of resistors is disposed inside the external electrostatic shield and outside of the one or more internal electrostatic shields. At least one remaining resistor of the series of resistors other than the external resistor and the first internal resistor is disposed inside the one or more internal electrostatic shields.

In one aspect, the external electrostatic shield surrounds an internal chamber in which the resistor or the resistors in the series other than the external resistor and in which the one or more internal electrostatic shields are disposed.

In one aspect, the external electrostatic shield and the one or more internal electrostatic shields divide parasitic capacitances between neighboring resistors in the series of resistors into smaller capacitances and directly conduct the smaller capacitances to an electrical ground.

In one aspect, the resistors in the series include a second internal resistor that is conductively coupled with the first internal resistor and disposed inside the external electrostatic shield and the first internal electrostatic shield, and further comprising a second internal electrostatic shield disposed inside the first internal electrostatic shield and the external electrostatic shield. The second internal electrostatic shield can be conductively coupled with the series of resistors with the first internal resistor and the second internal resistor disposed outside of the second internal electrostatic shield and the resistor or the resistors in the series of resistors other than the external resistor, the first internal resistor, and the second internal resistor disposed inside the second internal electrostatic shield.

In one aspect, the resistors in the series include at least a third internal resistor that is conductively coupled with the second internal resistor and disposed inside the external electrostatic shield, the first internal electrostatic shield, and the second internal electrostatic shield.

In one aspect, a first input terminal of the input terminals is coupled with the at least the third internal resistor inside the second internal electrostatic shield and the sensing terminals are coupled with the sensing resistor outside of the external electrostatic shield.

In one aspect, the assembly also includes a circuit board formed from dielectric layers and conductive layers. The external electrostatic shield can include at least one of the conductive layers in the circuit board and the one or more internal electrostatic shields include one or more of the conductive layers in the printed circuit board. The conductive layers in the external electrostatic shield and the one or more internal electrostatic shields can be separated from each other by one or more of the dielectric layers of the circuit board.

In another embodiment, another assembly (e.g., another voltage divider circuit assembly) includes plural resistors, an external electrostatic shield, one or more internal electrostatic shields, and a circuit board. The resistors are conductively coupled in a series with each other between input terminals that are configured to receive an input voltage across the input terminals. At least one of the resistors includes an external resistor that is disposed between sensing terminals. The sensing terminals are configured to conduct an output voltage that is the input voltage divided by the resistors in the series. The external electrostatic shield is conductively coupled with the series of the resistors with the external resistor disposed outside of the external electrostatic shield and the resistor or the resistors in the series other than the external resistor disposed inside the external electrostatic shield. The one or more internal electrostatic shields are conductively coupled with the series of resistors and disposed inside the external electrostatic shield. A first internal resistor in the series of resistors is disposed inside the external electrostatic shield and outside of the one or more internal electrostatic shields. The circuit board is formed from dielectric layers and conductive layers. The external electrostatic shield includes at least one of the conductive layers in the circuit board and the one or more internal electrostatic shields include one or more of the conductive layers in the printed circuit board. The conductive layers included in the external electrostatic shield and the one or more internal electrostatic shields are separated from each other by one or more of the dielectric layers of the circuit board.

In one aspect, at least one remaining resistor of the series of resistors other than the external resistor and the first internal resistor is disposed inside the one or more internal electrostatic shields.

In one aspect, the external electrostatic shield surrounds an internal chamber in which the resistor or the resistors in the series other than the external resistor and in which the one or more internal electrostatic shields are disposed.

In one aspect, the external electrostatic shield and the one or more internal electrostatic shields divide parasitic capacitances between neighboring resistors in the series of resistors into smaller capacitances and directly conduct the smaller capacitances to an electrical ground.

In one aspect, the resistors in the series include a second internal resistor that is conductively coupled with the first internal resistor and disposed inside the external electrostatic shield and the first internal electrostatic shield. The assembly also can include a second internal electrostatic shield disposed inside the first internal electrostatic shield and the external electrostatic shield. The second internal electrostatic shield can be conductively coupled with the series of resistors with the first internal resistor and the second internal resistor disposed outside of the second internal electrostatic shield and the resistor or the resistors in the series of resistors other than the external resistor, the first internal resistor, and the second internal resistor disposed inside the second internal electrostatic shield.

In one aspect, the resistors in the series include at least a third internal resistor that is conductively coupled with the second internal resistor and disposed inside the external electrostatic shield, the first internal electrostatic shield, and the second internal electrostatic shield.

In one aspect, a first input terminal of the input terminals is coupled with the at least the third internal resistor inside the second internal electrostatic shield and the sensing terminals are coupled with the sensing resistor outside of the external electrostatic shield.

The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. The various embodiments are not limited to the arrangements and instrumentality shown in the drawings.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:
1. A circuit assembly comprising:
a plurality of resistors conductively coupled in a series with each other forming a series of resistors between input terminals that are configured to receive an input voltage across the input terminals, wherein at least one of the plurality of resistors comprises an external resistor that is disposed between sensing terminals, wherein the sensing terminals are configured to conduct an output voltage that is the input voltage divided by the plurality of resistors in the series;

an external electrostatic shield conductively coupled with the plurality of resistors such that the external resistor is disposed outside of the external electrostatic shield and a resistor or resistors in the series of resistors other than the external resistor are disposed inside the external electrostatic shield; and one or more internal electrostatic shields disposed inside the external electrostatic shield with the resistor or the resistors in the series of resistors other than the external resistor disposed inside different shields of the external electrostatic shield and the one or more internal electrostatic shields.

2. The circuit assembly of claim 1, wherein the external electrostatic shield surrounds an internal chamber in which the resistor or the resistors in the series other than the external resistor are disposed.

3. The circuit assembly of claim 1, wherein the external electrostatic shield divides a parasitic capacitance between neighboring resistors in the series of resistors into smaller capacitances and directly conducts the smaller capacitances to an electrical ground.

4. The circuit assembly of claim 1, wherein resistors in the series of resistors comprise a first internal resistor that is conductively coupled with the external resistor and disposed inside the external electrostatic shield, and further comprising a first internal electrostatic shield disposed inside the external electrostatic shield and conductively coupled with the series of resistors such that the external resistor and the first internal resistor are disposed outside of the first internal electrostatic shield and the resistor or resistors in the series of resistors other than the external resistor and the first internal resistor are disposed inside the first internal electrostatic shield.

5. The circuit assembly of claim 4, wherein the resistors in the series of resistors comprise a second internal resistor that is conductively coupled with the first internal resistor and disposed inside the external electrostatic shield and the first internal electrostatic shield, and further comprising a second internal electrostatic shield disposed inside the first internal electrostatic shield and the external electrostatic shield, wherein the second internal electrostatic shield is conductively coupled with the series of resistors such that the first internal resistor and the second internal resistor are disposed outside of the second internal electrostatic shield and the resistor or the resistors in the series of resistors other than the external resistor, the first internal resistor, and the second internal resistor are disposed inside the second internal electrostatic shield.

6. The circuit assembly of claim 5, wherein the resistors in the series of resistors include at least a third internal resistor that is conductively coupled with the second internal resistor and is disposed inside the external electrostatic shield, the first internal electrostatic shield, and the second internal electrostatic shield.

7. The circuit assembly of claim 6, wherein a first input terminal of the input terminals is coupled with the at least the third internal resistor inside the second internal electrostatic shield and the sensing terminals are coupled with a sensing resistor outside of the external electrostatic shield.

8. The circuit assembly of claim 1, further comprising a circuit board formed from dielectric layers and conductive layers, wherein the external electrostatic shield comprises at least one of conductive layers in the circuit board and the one or more internal electrostatic shields comprise one or more of the conductive layers in the circuit board, wherein the conductive layers included in the external. electrostatic shield and the one or more internal electrostatic shields are separated from each other by one or more of the dielectric layers of the circuit board.

9. A circuit assembly comprising:

a plurality of resistors conductively coupled in a series with each other forming a series of resistors between input terminals that are configured to receive an input voltage across the input terminals, wherein at least one of the plurality of resistors comprises an external resistor that is disposed between sensing terminals, wherein the sensing terminals are configured to conduct an output voltage that is the input voltage divided by the resistors in the series;

an external electrostatic shield conductively coupled with the plurality of resistors such that the external resistor is disposed outside of the external electrostatic shield and a resistor or resistors in the series of resistors other than the external resistor are disposed inside the external electrostatic shield; and one or more internal electrostatic shields conductively coupled with the series of resistors and disposed inside the external electrostatic shield, wherein a first internal resistor in the series of resistors is disposed inside the external electrostatic shield and outside of the one or more internal electrostatic shields, and Wherein at least one remaining resistor of the series of resistors other than the external resistor and the first internal resistor is disposed inside the one or more internal electrostatic shields.

10. The circuit assembly of claim 9, wherein the external electrostatic shield surrounds an internal chamber in which the resistor or the resistors in the series other than the external resistor and in which the one or more internal electrostatic shields are disposed.

11. The circuit assembly of claim 9, wherein the external electrostatic shield and the one or more internal electrostatic shields divide parasitic capacitances between neighboring resistors in the series of resistors into smaller capacitances and directly conduct the smaller capacitances to an electrical ground.

12. The circuit assembly of claim 9, wherein resistors in the series of resistors comprise a second internal resistor that is conductively coupled with the first internal resistor and disposed inside the external electrostatic shield and the first internal electrostatic shield, and further comprising a second internal electrostatic shield disposed inside the first internal electrostatic shield and the external electrostatic shield, wherein the second internal electrostatic shield is conductively coupled with the series of resistors such that the first internal resistor and the second internal resistor are disposed outside of the second internal electrostatic shield and the resistor or the resistors in the series of resistors other than the external resistor, the first internal resistor, and the second internal resistor are disposed inside the second internal electrostatic shield.

13. The circuit assembly of claim 12, wherein the resistors in the series comprise at least a third internal resistor that is conductively coupled with the second internal resistor and disposed inside the external electrostatic shield, the first internal electrostatic shield, and the second internal electrostatic shield.

14. The circuit assembly of claim 13, wherein a first input terminal of the input terminals is coupled with the at least the third. internal resistor inside the second internal electrostatic shield and the sensing terminals are coupled with a sensing resistor outside of the external electrostatic shield.

15. The circuit assembly of claim 9, further comprising a circuit board formed from dielectric layers and conductive layers, wherein the external electrostatic shield comprises at least one of the conductive layers in the circuit board and the one or more internal electrostatic shields comprise one or more of the conductive layers in the circuit board, wherein the conductive layers included in the external electrostatic shield and the one or more internal electrostatic shields are separated from each other by one or more of the dielectric layers of the circuit board.

16. A circuit assembly comprising
a plurality of resistors conductively coupled in a series with each other forming a series of resistors between input terminals that are configured to receive an input voltage across the input terminals, wherein at least one of the plurality of resistors comprises an external resistor that is disposed between sensing terminals, wherein the sensing terminals are configured to conduct an output voltage that is the input voltage divided by the resistors in the series;
an external electrostatic shield conductively coupled with the plurality of resistors such that the external resistor is disposed outside of the external electrostatic shield and a resistor or resistors in the series of resistors other than the external resistor are disposed inside the external electrostatic shield;
one or more internal electrostatic shields conductively coupled with the series of resistors and disposed inside the external electrostatic shield, wherein a first internal resistor in the series of resistors is disposed inside the external electrostatic shield and outside of the one or more internal electrostatic shields; and
a circuit board formed from dielectric layers and conductive layers, wherein the external electrostatic shield comprises at least one of the conductive layers in the circuit board and the one or more internal electrostatic shields comprise one or more of the conductive layers in the circuit board, wherein the conductive layers included in the external electrostatic shield and the one or more internal electrostatic shields are separated from each other by one or more of the dielectric layers of the circuit board.

17. The circuit assembly of claim 16, wherein at least one remaining resistor of the series of resistors other than the external resistor and the first internal resistor is disposed inside the one or more internal electrostatic shields.

18. The circuit assembly of claim 16, wherein the external electrostatic shield surrounds an internal chamber in which the resistor or the resistors in the series other than the external resistor and in which the one or more internal electrostatic shields are disposed.

19. The circuit assembly of claim 16, wherein the external electrostatic shield and the one or more internal electrostatic shields divide parasitic capacitances between neighboring resistors in the series of resistors into smaller capacitances and directly conduct the smaller capacitances to an electrical ground.

* * * * *